United States Patent
Dorta-Quiñones (10) Patent No.: US 11,237,585 B2
(45) Date of Patent: Feb. 1, 2022

(54) SELF-BIASED CURRENT TRIMMER WITH DIGITAL SCALING INPUT

(71) Applicant: Marvell Asia Pte, Ltd., Singapore (SG)

(72) Inventor: Carlos Dorta-Quiñones, Cambridge, MA (US)

(73) Assignee: MARVEL ASIA PTE, LTD., Singapore (SG)

(*) Notice: Subject to any disclaimer, the term of this patent is extended or adjusted under 35 U.S.C. 154(b) by 0 days.

(21) Appl. No.: 15/796,645

(22) Filed: Oct. 27, 2017

(65) Prior Publication Data
US 2019/0129460 A1    May 2, 2019

(51) Int. Cl.
| | | |
|---|---|---|
| G05F 3/20 | (2006.01) | |
| H03K 17/22 | (2006.01) | |
| G05F 3/26 | (2006.01) | |
| H03M 1/78 | (2006.01) | |
| G06F 30/39 | (2020.01) | |

(52) U.S. Cl.
CPC .............. *G05F 3/205* (2013.01); *G06F 30/39* (2020.01); *H03K 17/223* (2013.01); *G05F 3/262* (2013.01); *H03M 1/785* (2013.01)

(58) Field of Classification Search
CPC ...... G05F 3/205; G05F 3/262; G06F 17/5068; H03K 17/223; H03M 1/785
See application file for complete search history.

(56) References Cited

U.S. PATENT DOCUMENTS

| | | | | |
|---|---|---|---|---|
| 5,243,231 A | * | 9/1993 | Baik | G05F 3/262 327/535 |
| 7,848,151 B2 | * | 12/2010 | Chan | G11C 16/12 365/185.19 |
| 7,990,300 B2 | * | 8/2011 | Takiguchi | H03M 1/0604 341/144 |
| 2008/0186085 A1 | * | 8/2008 | Hsu | H03H 11/24 327/543 |

* cited by examiner

*Primary Examiner* — Lincoln D Donovan
*Assistant Examiner* — Colleen J O Toole
(74) *Attorney, Agent, or Firm* — Hamilton, Brook, Smith & Reynolds, P.C.

(57) ABSTRACT

In an embodiment, a circuit provided by the present invention includes a transistor connected to allow current to flow from a voltage supply to an output port. The circuit further includes a resistance ladder digital-to-analog converter ($R_{DAC}$) configured to receive a digital input that indicates a voltage scaling factor. The $R_{DAC}$ is further configured to receive an input voltage ($V_B$) at a voltage input port and produce an output voltage ($V_A$). The circuit further includes an amplifier having an output port connected to a gate of the first transistor, an inverting input port receiving the output voltage ($V_A$), and a non-inverting input connected to the output port of the first transistor.

21 Claims, 6 Drawing Sheets

SELF-BIASED CURRENT TRIMMER WITH DIGITAL SCALING INPUT

BACKGROUND

Reference circuits are one of the fundamental building blocks in analog integrated circuit (IC) design. High-performance analog ICs require a stable biasing point to function reliably across a wide range of operating conditions. Current references provide all sensitive analog blocks with identical copies of a reference current. The reference current is designed to remain constant across process, voltage and temperature (PVT) variations. Typically, a feedback amplifier provides a replica of a precision bandgap reference voltage across an external precision resistor to generate a PVT-independent reference current. A current-mirror provides identical scaled replicas of the reference current to the various analog blocks in remote locations of the chip. Current trimming is a known technique that can compensate for inaccurate analog device models in advanced complementary metal-oxide-semiconductor (CMOS) processes targeting digital applications.

SUMMARY

In an embodiment, a circuit provided by the present invention includes a transistor connected to allow current to flow from a voltage supply to an output port. The circuit further includes a resistance ladder digital-to-analog converter ($R_{DAC}$) configured to receive a digital input that indicates a voltage scaling factor. The $R_{DAC}$ is further configured to receive an input voltage ($V_B$) at a voltage input port and produce an output voltage ($V_A$). The circuit further includes an amplifier having an output port connected to a gate of the first transistor, an inverting input port receiving the output voltage ($V_A$), and a non-inverting input connected to the output port of the first transistor.

In an embodiment, the transistor is a first transistor and the amplifier is a first amplifier. The circuit further includes a second amplifier having an inverting input port receiving a reference voltage ($V_{REF}$), and a non-inverting input port connected to the input voltage port of the $R_{DAC}$, such that $V_B$ is equal to $V_{REF}$. The circuit further includes a second transistor connected to allow current to flow from the voltage supply to the voltage input port of the $R_{DAC}$, and further includes a gate that is connected to receive an output of the second amplifier.

In an embodiment, the circuit further includes a startup circuit, a third transistor, and a fourth transistor. The startup circuit outputs a signal to the gates of the first, third, and fourth transistor, which are connected to the output of the first amplifier. The third transistor is configured to allow current to flow from the voltage supply to a bias current port of the first amplifier. The fourth transistor is configured to allow current to flow from the voltage supply to a bias current port of the second amplifier.

In an embodiment, the output port is connected to a resistor that is on-chip.

In an embodiment, the output port is connected to a resistor that is off-chip.

In an embodiment, the circuit can further include at least one additional transistor. Each of the additional transistors can be configured to allow current to flow from the voltage supply to an output port respective to each additional transistor. Each of the additional transistors can include a gate that is connected to the output port of the first amplifier. The output port of each of the additional transistors has the same voltage ($V_Y$) as the voltage established at the non-inverting input of the first amplifier ($V_X$) within a particular tolerance range.

In an embodiment, a drain-to-source voltage of the transistor is greater than a threshold required for operation for that transistor as a current source.

In an embodiment, the resistance ladder is programmable.

In an embodiment, a method includes allowing current to flow through a transistor from a voltage supply to an output port. The method further includes producing an output voltage ($V_A$) at a resistance ladder, based on a digital input that indicates a voltage scaling factor, and an input voltage ($V_B$) received at a voltage input port of the resistance ladder. The method further includes receiving the output voltage ($V_A$) at an inverting input port of an amplifier having an output port connected to a gate of first transistor, the non-inverting input being connected to the output port.

In an embodiment, the amplifier is a first amplifier and the circuit further includes a second amplifier. The second amplifier has a non-inverting input receiving a reference voltage ($V_{REF}$), and an inverting input port connected to an output port of the second amplifier and to the input voltage port of the $R_{DAC}$, such that $V_B$ is equal to $V_{REF}$.

In an embodiment, a method of designing a chip includes providing an initial design of the chip that includes a resistance ladder configured to trim a reference voltage based on a programmable input. The method further includes fabricating a physical chip based on the initial design of the chip. The method further includes testing the chip to determine whether output currents are correct. If output currents are incorrect, the method adjusts the programmable input to the resistance ladder to correct the output currents.

In an embodiment, a system for designing a chip includes a circuit having an initial design including a resistance ladder configured to trim a reference voltage based on a programmable input. The chip is configured to allow for testing the chip to determine whether output currents are correct. If output currents are incorrect, the system enables user adjustment of the programmable input to the resistance ladder to correct the output currents.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

Integrated circuits (ICs) typically require a combination of direct current (DC) and/or alternating current (AC) signals to communicate with the outside world. These types of signals are generally produced by analog circuits that are sensitive to process, voltage, and temperature (PVT) variations.

Figure 1A:
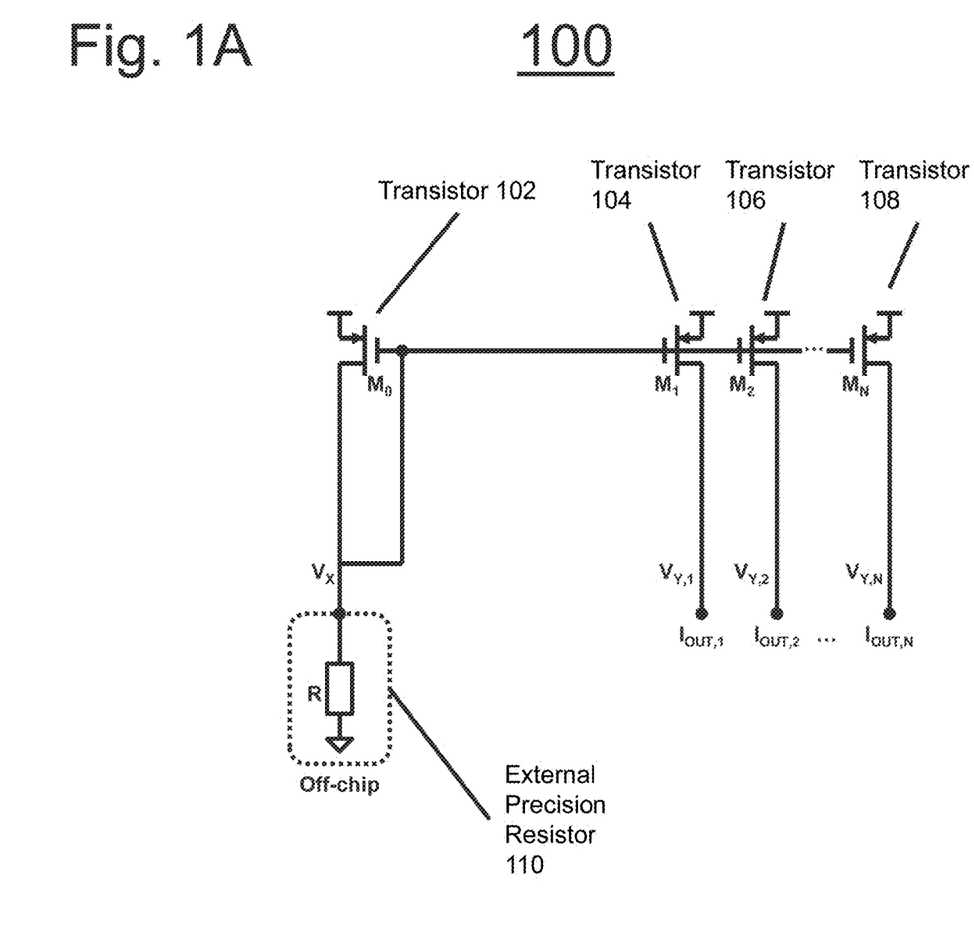
FIG. 1A is a circuit diagram illustrating an example embodiment of a current reference.

FIG. 1A is a circuit diagram 100 illustrating an example embodiment of a current reference. A simple current reference can be implemented using a basic current mirror and an external precision resistor R 110. The ratio of $V_X$ and R sets the input current, which flows from the voltage supply through the transistor $M_0$ 102 and is mirrored onto transistors $M_n$ 104, 106, and 108, where n=1, 2, ..., N. Since node $V_X$ is sensitive to PVT variations, output currents are also sensitive to these same PVT variations.

Figure 1B:
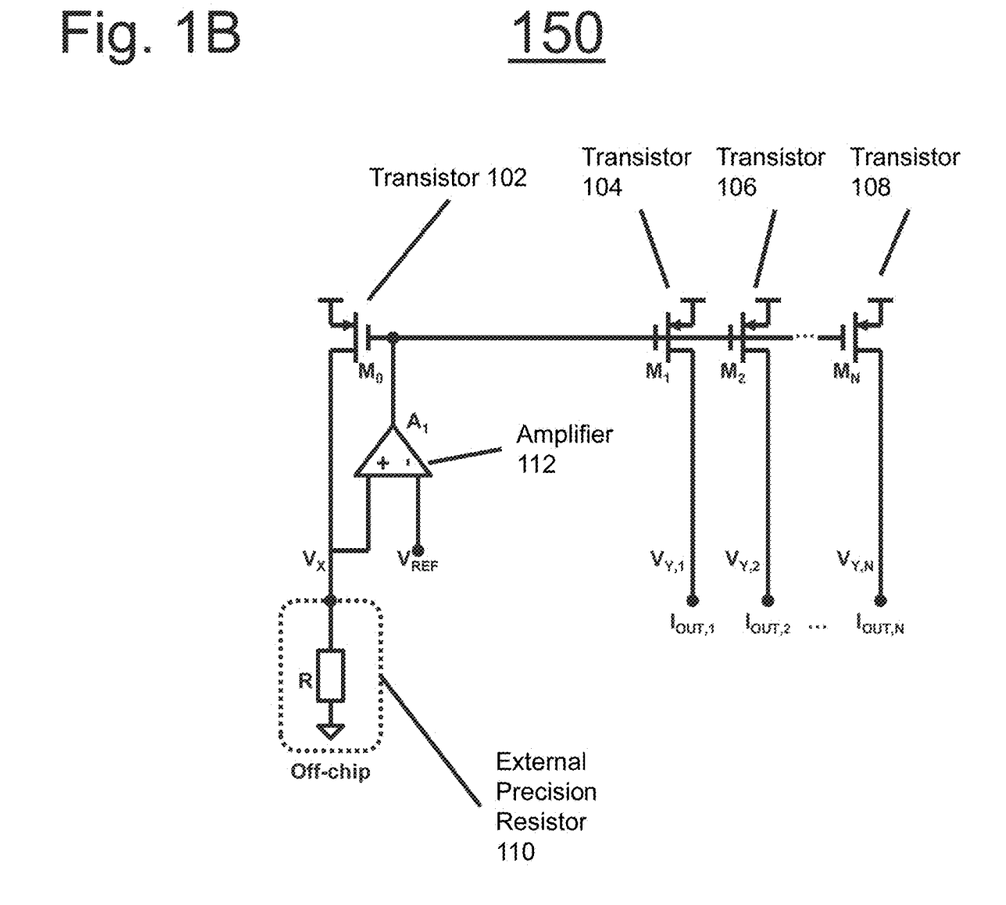
FIG. 1B is a circuit diagram illustrating an example embodiment of a current reference.

FIG. 1B is a circuit diagram 150 illustrating another example embodiment of a current reference. An enhanced current reference can be implemented using an active-input current mirror and a precision reference voltage $V_{REF}$. The negative feedback loop consisting of transistor $M_0$ and high-gain amplifier $A_1$ 112 forces the voltage $V_X$ to be equal to $V_{REF}$ at the two inverting and non-inverting inputs, respectively, of the amplifier $A_1$ 112. The ratio of $V_{REF}$ and R sets the current flowing through reference transistor $M_0$, which is mirrored through transistors $M_1$ through $M_N$, where N represents the total number of output currents. If $V_{REF}$ and R are PVT-insensitive, the output currents through transistors $M_n$ 104, 106, and 108, where n=1, 2, ..., N, are also PVT-insensitive. However, if $V_{REF}$ and R are PVT sensitive, then the output currents are also PVT sensitive.

Thus, analog circuits need a stable biasing point to function reliably across a wide range of operating conditions. A precision voltage and/or current reference circuit provides such stable DC operating point. Generating and distributing a reference voltage across different parts of a chip may cause undesired errors due to the finite resistance between grounds that are far apart. Therefore, generating and distributing a reference current is the recommended method.

A person of ordinary skill in the art recognizes that a transistor operates in the saturation region to behave as an ideal current source. This requirement is satisfied when the voltage across the drain and source of the transistor exceeds a minimum compliance voltage. In low-voltage applications using supply voltages that are below 1 volt (sub-1V), generating a reference voltage $V_{REF}$ much lower than the supply voltage can be difficult in certain applications. In these applications, providing a replica of $V_{REF}$ directly at node $V_X$ may cause the transistor to operate outside the saturation region, which degrades current mirroring accuracy. To overcome this challenge, an additional programmable voltage divider can be added to the circuit. An input digital code $D_{IN}$ (e.g., digital scaling input) selects the desired analog output voltage $V_A$, where $V_A$ is a fraction of $V_{REF}$ (e.g., $V_A = c \cdot V_{REF}$, where $0 < c \leq 1$), to produce a voltage $V_X$ that ensures the reference transistor $M_0$ operates deep in the saturation region within a considerable margin. Therefore, current trimming via a programmable digital-to-analog (DAC) converter is a desirable feature that can enable calibration from memory for added convenience.

Figure 2:
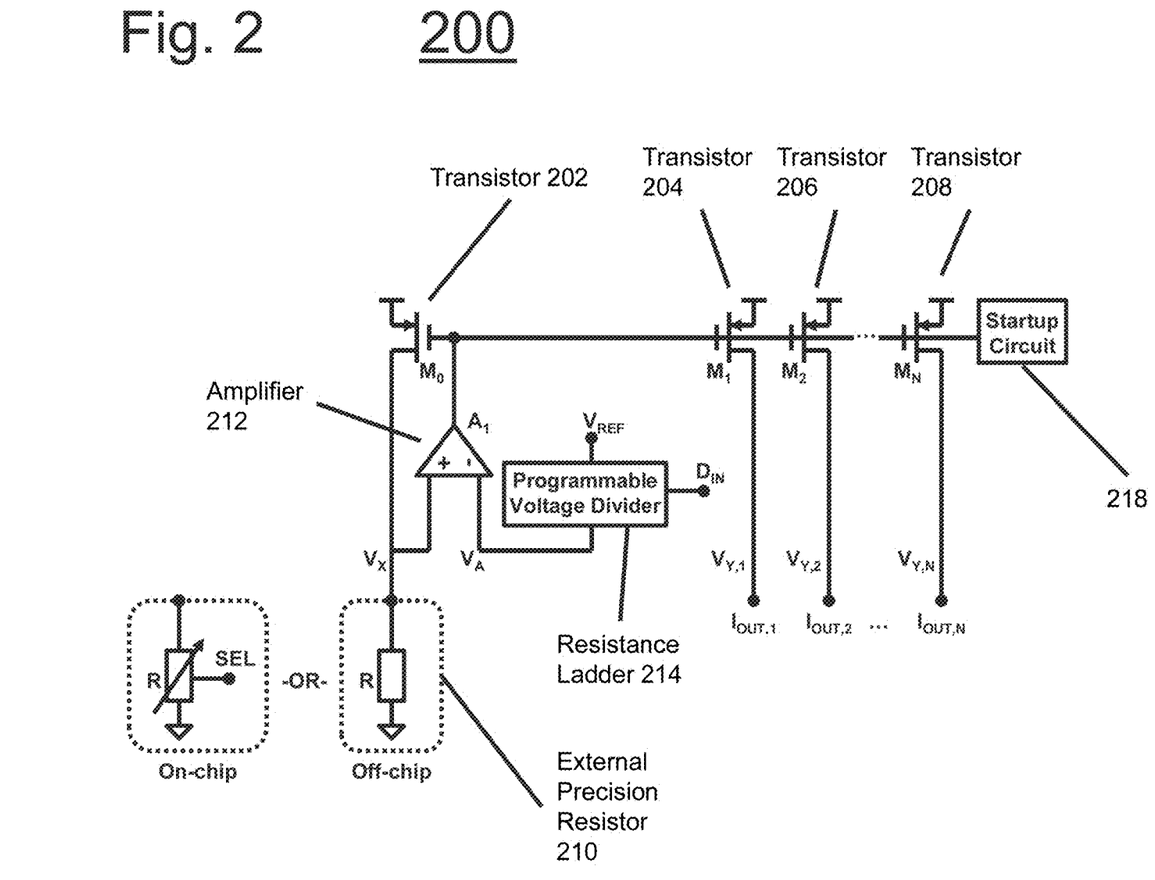
FIG. 2 is a circuit diagram illustrating a current trimmer employed by an example embodiment of the present invention.

FIG. 2 is a circuit diagram 200 illustrating an example embodiment of a current trimmer employed by the present invention. An embodiment of the present invention is a self-biased current reference circuit employing a digital trimming technique based on a programmable resistive digital-to-analog converter ($R_{DAC}$) or resistance ladder.

An output of an amplifier $A_1$ 212 is connected to a transistor $M_0$ 202. The inverting input of the amplifier 212 receives a divided voltage $V_A$ from a programmable voltage divider 214, such as a resistance ladder or $R_{DAC}$, based on a reference voltage $V_{REF}$ and a digital input $D_{IN}$ specifying an amount or ratio to divide the reference voltage. The non-inverting input to the amplifier is $V_X$, which is connected to the external precision resistor 210 and the current path of the transistor $M_0$ 202. Connected in this manner, $V_X$ is closer in value to respective mirror voltages $V_{Y,1}$, $V_{Y,2}$, ... $V_{Y,N}$ with respect to respective transistors $M_1$ 204, $M_2$ 206, ..., $M_N$ 208.

Figure 3:
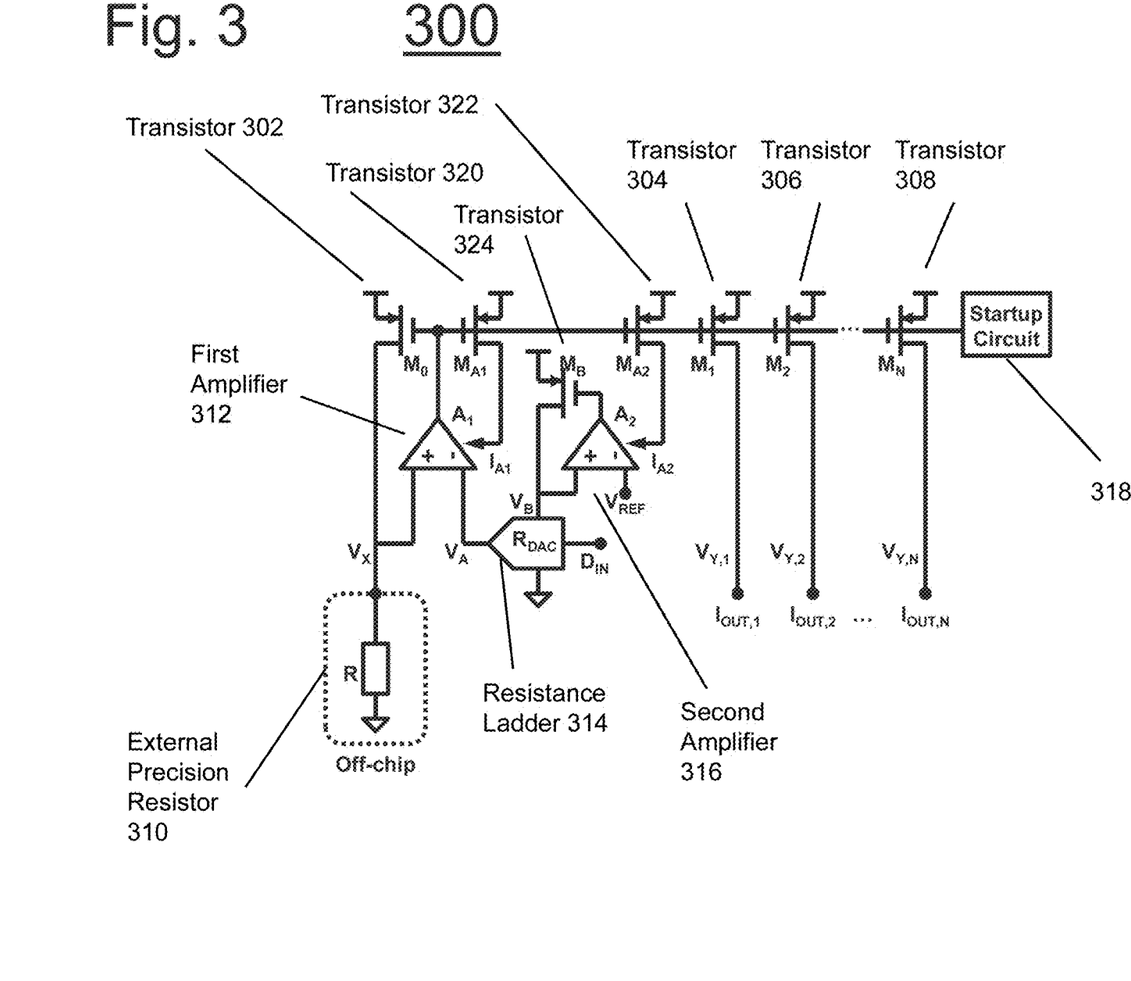
FIG. 3 is a circuit diagram illustrating a current trimmer employed by an example embodiment of the present invention.

FIG. 3 is a circuit diagram 300 illustrating an example embodiment of a current trimmer employed by the present invention. In FIG. 3, the circuit diagram 300 includes an additional amplifier $A_2$ 316 and an R-2R resistor-ladder DAC($R_{DAC}$) 314. A string resistor-ladder DAC may be used in a different embodiment, at the cost of higher complexity and area. The negative feedback loop of transistor $M_B$ 324 and high-gain amplifier $A_2$ 316 forces the voltage $V_B$ to be equal to $V_{REF}$, which sets the full-scale range of the $R_{DAC}$ 314. A digital input code $D_{IN}$ selects the desired analog output voltage $V_A$, where $V_A < V_{REF}$. The negative feedback loop including transistor $M_0$ 302 and high-gain amplifier $A_1$ 312 forces the voltage at node $V_X$ to be equal to $V_A$, the output of the $R_{DAC}$ 314. Amplifiers $A_1$ 312 and $A_2$ 316 are self-biased through transistors $M_{A1}$ 320 and $M_{A2}$ 322.

The self-biased trimmable current reference can be implemented using a second amplifier $A_2$ 316 and a resistor-ladder digital-to-analog converter ($R_{DAC}$) 314. The negative feedback loop of transistor $M_B$ and high-gain amplifier $A_2$ forces the voltage $V_B$, which is input to the non-inverting input of $A_2$ 316 to be equal to $V_{REF}$, which sets the full-scale range of the $R_{DAC}$ 314. The input digital code $D_{IN}$ selects the desired analog output voltage $V_A$, where $0 < V_A \leq V_B$. Amplifiers $A_1$ 312 and $A_2$ 316 are self-biased through additional transistors $M_{A1}$ 320 and $M_{A2}$ 322.

The self-biased current reference has two stable states: an undesired dead state, which provides zero output current, and a desired operating point. An additional startup circuit 318 ensures the current reference circuit never operates in the undesired dead state. The startup circuit is designed so as to provide a signal to the rest of the circuit that prevents operation in the undesired dead state and also to not interfere with circuit performance during normal operation. To prevent the dead state, the startup circuit effectively detects that a dead state is present, and if so, turns on current flow through all transistors $M_0$ through $M_N$.

Figure 4:
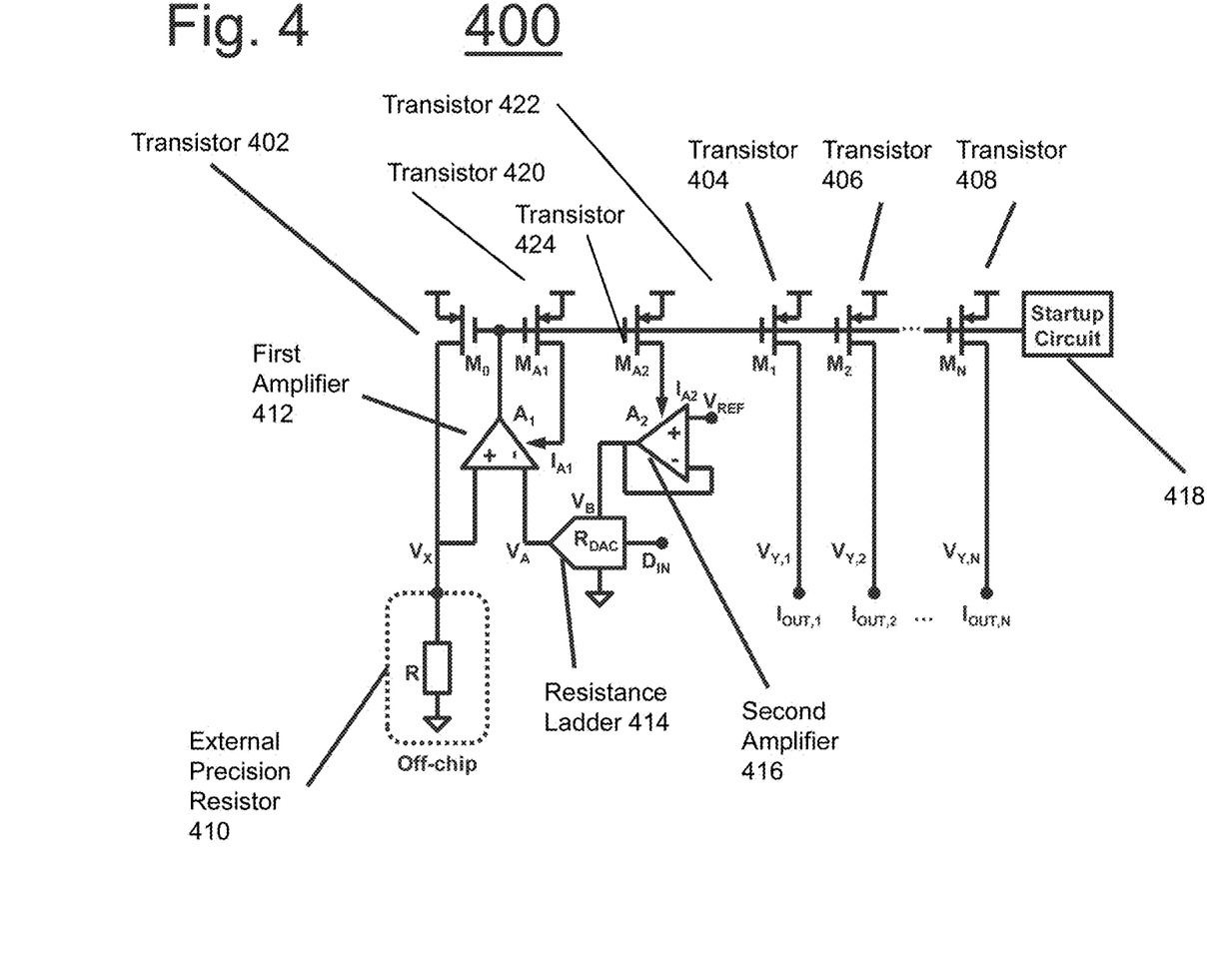
FIG. 4 is a circuit diagram illustrating a current trimmer employed by an example embodiment of the present invention.

FIG. 4 is a circuit diagram 400 illustrating an example embodiment of a current trimmer employed by an embodiment of the present invention.

A self-biased trimmable current reference can be implemented using an additional amplifier $A_2$ and a resistor-ladder digital-to-analog converter ($R_{DAC}$) 414. The unity-gain configuration of amplifier $A_2$ forces the voltage $V_B$ to be equal to $V_{REF}$, which sets the full-scale range of the $R_{DAC}$ 414. An input digital code $D_{IN}$ selects the desired analog output voltage $V_A$, where $0 < V_A \leq V_B$. Amplifiers $A_1$ 412 and $A_2$ 416 are self-biased through additional transistors $M_{A1}$ 420 and $M_{A2}$ 422. The self-biased current reference has two stable states: an undesired and a desired operating point. An additional startup circuit 418 ensures the current reference circuit never operates in the undesired state. The startup circuit 418 is designed to mitigate any effect on circuit performance during normal operation.

One novel aspect of embodiments of the present invention is performing a voltage trim via a resistor-ladder instead of a current trim via the current mirror transistors. Performing a voltage trim using a resistor ladder allows for $V_{REF}$ to be pre-scaled before it is converted to a current. This pre-scaling provides at least two advantages. First, the pre-scaling provides a drain voltage $V_X$ that is closer to the average output drain voltages $V_{Y,1}$ through $V_{Y,N}$, which increases current mirroring accuracy by minimizing systematic mismatch. Second, the pre-scaling provides a larger drain-to-source voltage across reference transistor $M_0$, which increases current mirroring accuracy by minimizing random mismatch.

Another advantage of the present invention is allowing the circuit designer to adjust $D_{IN}$ in real time, allowing for dynamic voltage scaling of $V_X$ using a digital input. Further, such flexibility allows for circuit designs to be duplicated and subsequently employed in many PVT conditions, and adjusting $D_{IN}$ as necessary to achieve the desired voltage scale.

Figure 5:
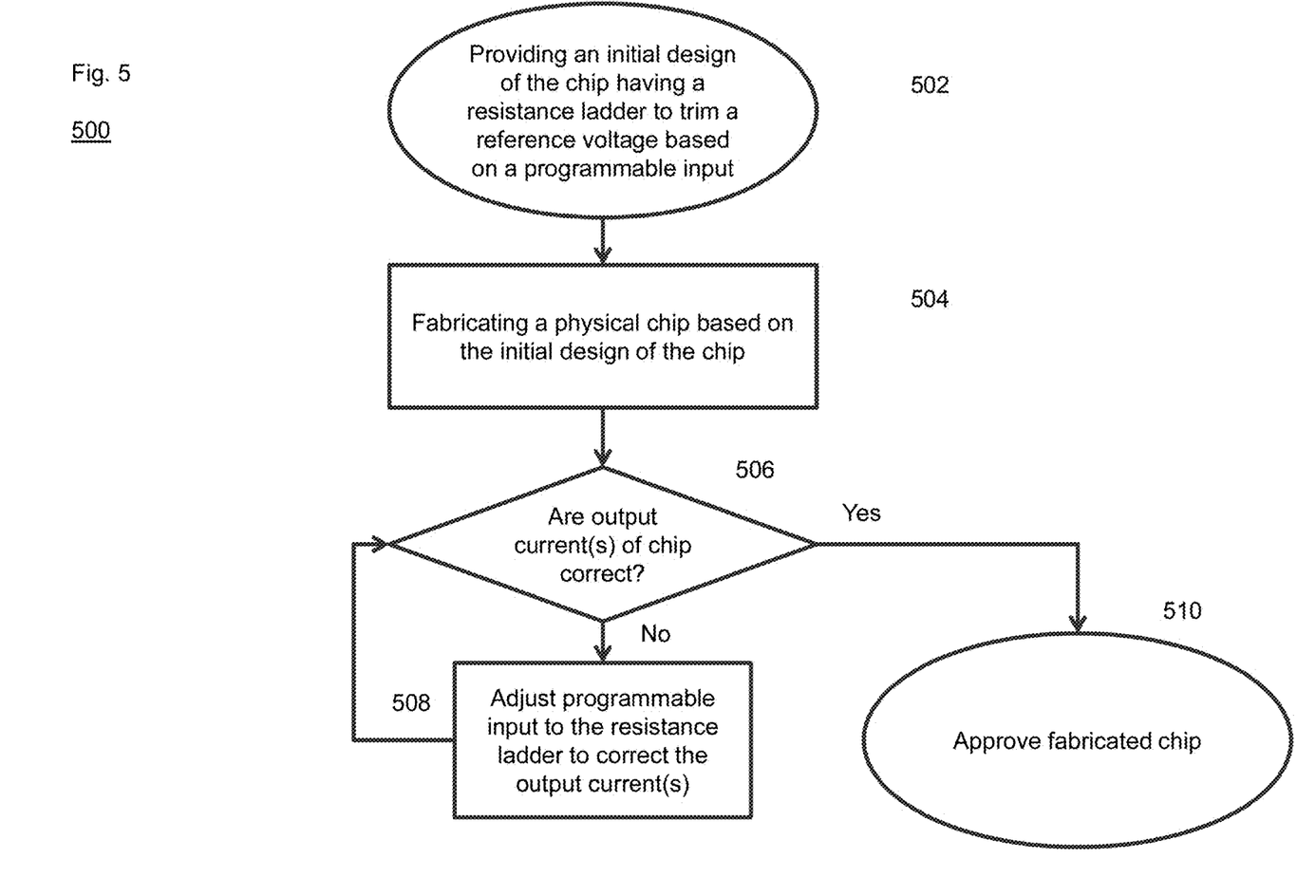
FIG. 5 is a flow diagram illustrating a method employed by an example embodiment of the present invention.

FIG. 5 is a flow diagram 500 illustrating an example embodiment of a method employed by the present invention. The method provides an initial design of the chip having a resistance ladder to trim a reference voltage based on a programmable input (502). Then, the method fabricates or manufactures a physical chip (e.g., an integrated circuit (IC)) based on the initial design of the chip (504). The method then determines whether the output voltage(s) of the chip are correct (506). If not, the method adjusts the programmable input to the resistance ladder of the physical chip to correct the output voltage(s) (508). Then, the method re-tests the output (506) voltages, and if incorrect, adjusts the programmable input to the resistance ladder again (508). This can be repeated until the output currents are determined to be correct (506). When the output currents are correct (506), the method approves the fabricated chip (510).

While example embodiments have been particularly shown and described, it will be understood by those skilled in the art that various changes in form and details may be made therein without departing from the scope of the embodiments encompassed by the appended claims.

What is claimed is:

1. A circuit comprising:
a first transistor connected to allow current to flow from a voltage supply to an output port;
a resistance ladder digital-to-analog converter ($R_{DAC}$) configured to receive a digital input that indicates a voltage scaling factor, the $R_{DAC}$ further configured to receive an input voltage ($V_B$) at a voltage input port and produce an output voltage ($V_A$);
a first amplifier having an output port connected to a gate of the first transistor, an inverting input port receiving the output voltage ($V_A$) from the $R_{DAC}$, and a non-inverting input connected to the output port of the first transistor;
a second amplifier having an inverting input port receiving a reference voltage ($V_{REF}$), and a non-inverting input port connected to the input voltage port of the $R_{DAC}$, such that $V_B$ is equal to $V_{REF}$;
a second transistor connected to allow current to flow from the voltage supply to the voltage input port of the $R_{DAC}$, and further having a gate that is connected to receive an output of the second amplifier;
a third transistor configured to allow current to flow from the voltage supply to a bias current port of the first amplifier;
a fourth transistor; and
a startup circuit configured to output a signal to the gates of the first, third, and fourth transistor.

2. The circuit of claim 1, wherein the gates of the third and fourth transistors are connected to the output of the first amplifier.

3. The circuit of claim 1, wherein the output port is connected to a resistor that is on-chip.

4. The circuit of claim 1, wherein the output port is connected to a resistor that is off-chip.

5. The circuit of claim 1, further comprising:
at least one additional transistor, wherein each of the additional transistors is configured to allow current to flow from the voltage supply to an output port respective to each additional transistor, and further each of the additional transistors includes a gate that is connected to the output port of the first amplifier;
wherein the output port of each of the additional transistors has a same voltage ($V_Y$) as a particular voltage ($V_x$) established at the non-inverting input of the first amplifier within a particular tolerance range.

6. The circuit of claim 1, wherein a drain-to-source voltage of the transistor is greater than a threshold required for operation for that transistor as a current source.

7. The circuit of claim 1, wherein the resistance ladder is programmable.

8. A method of designing a chip, the method comprising:
providing an initial design of the chip, the design including a first transistor and a resistance ladder configured to trim a reference voltage based on a programmable input;
fabricating a physical chip based on the initial design of the chip;
testing the chip to determine whether output currents are correct; and
if output currents are incorrect, adjusting the programmable input to the resistance ladder to correct the output currents;
wherein the first transistor is connected to allow current to flow from a voltage supply to an output port;
wherein the resistance ladder is configured to receive a digital input that indicates a voltage scaling factor, the resistance ladder further configured to receive an input voltage ($V_B$) at a voltage input port and produce an output voltage ($V_A$);
wherein a first amplifier includes an output port connected to a gate of the first transistor, an inverting input port receiving the output voltage ($V_A$) from the resistance ladder, and a non-inverting input directly connected to the output port of the first transistor, a second amplifier includes an inverting input port receiving a reference voltage ($V_{REF}$), and a non-inverting input port connected to the input voltage port of an $R_{DAC}$, such that $V_B$ is equal to $V_{REF}$, and a second transistor is connected to allow current to flow from the voltage supply to the voltage input port of the $R_{DAC}$, and further having a gate that is connected to receive an output of the second amplifier;
wherein a startup circuit is configured to output a signal to the gates of the first transistor, a third transistor, and a fourth transistor, the third transistor configured to allow current to flow from the voltage supply to a bias current port of the first amplifier.

9. A method comprising:
allowing current to flow through a first transistor from a voltage supply to an output port;
producing an output voltage ($V_A$) at a resistance ladder, based on a digital input that indicates a voltage scaling factor, and an input voltage ($V_B$) received at a voltage input port of the resistance ladder;

receiving the output voltage ($V_A$) from the resistance ladder at an inverting input port of a first amplifier having an output port connected to a gate of the first transistor, wherein the non-inverting input is directly connected to the output port;

receiving a reference voltage ($V_{REF}$) at an inverting input port of a second amplifier, a non-inverting input port of the second amplifier connected to the input voltage port of the resistance ladder, such that $V_B$ is equal to $V_{REF}$;

allowing current flow through a second transistor from the voltage supply to the voltage input port of the resistance ladder, wherein the second transistor has a gate that is connected to receive an output of the second amplifier; and outputting a signal from a startup circuit to the gates of the first transistor, a third transistor, and a fourth transistor, wherein the third transistor is configured to allow current to flow from the voltage supply to a bias current port of the first amplifier.

10. The method of claim 9, wherein the gates of the third and fourth transistors are connected to the output of the first amplifier.

11. The method of claim 9, wherein the output port is connected to a resistor that is on-chip.

12. The method of claim 9, wherein the output port is connected to a resistor that is off-chip.

13. The method of claim 9, further comprising:
providing at least one additional transistor, wherein each of the additional transistors is configured to allow current to flow from the voltage supply to an output port respective to each additional transistor, and further each of the additional transistors includes a gate that is connected to the output port of the first amplifier;
wherein the output port of each of the additional transistors has a same voltage ($V_Y$) as a particular voltage ($V_X$) established at the non-inverting input of the first amplifier within a particular tolerance range.

14. The method of claim 9, wherein a drain-to-source voltage of the transistor is greater than a threshold required for operation for that transistor as a current source.

15. The method of claim 9, wherein the resistance ladder is programmable.

16. A system for designing a chip, the system comprising:
a circuit having an initial design including a first transistor and a resistance ladder configured to trim a reference voltage based on a programmable input, wherein the chip is configured to allow for testing the chip to determine whether output currents are correct, and if output currents are incorrect, enabling user adjustment of the programmable input to the resistance ladder to correct the output currents;
wherein the first transistor of the circuit is connected to allow current to flow from a voltage supply to an output port;
wherein the resistance ladder is configured to receive a digital input that indicates a voltage scaling factor, the resistance ladder further configured to receive an input voltage ($V_B$) at a voltage input port and produce an output voltage ($V_A$);
wherein a first amplifier includes an output port connected to a gate of the first transistor, an inverting input port receiving the output voltage ($V_A$) from the resistance ladder, and a non-inverting input directly connected to the output port of the first transistor, a second amplifier includes an inverting input port receiving a reference voltage ($V_{REF}$), and a non-inverting input port connected to the input voltage port of an $R_{DAC}$, such that $V_B$ is equal to $V_{REF}$, and a second transistor is connected to allow current to flow from the voltage supply to the voltage input port of the $R_{DAC}$, and further having a gate that is connected to receive an output of the second amplifier;
wherein a startup circuit is configured to output a signal to the gates of the first transistor, a third transistor, and a fourth transistor, wherein the third transistor is configured to allow current to flow from the voltage supply to a bias current port of the first amplifier.

17. The circuit of claim 1, wherein the second transistor is connected to allow current to flow directly from the voltage supply to the voltage input port of the $R_{DAC}$.

18. A circuit comprising:
a first transistor connected to allow current to flow from a voltage supply to an output port;
a resistance ladder digital-to-analog converter ($R_{DAC}$) configured to receive a digital input that indicates a voltage scaling factor, the $R_{DAC}$ further configured to receive an input voltage ($V_B$) at a voltage input port and produce an output voltage ($V_A$);
a first amplifier having an output port connected to a gate of the first transistor, an inverting input port receiving the output voltage ($V_A$) from the $R_{DAC}$, and a non-inverting input connected to the output port of the first transistor;
a second amplifier having an inverting input port receiving a reference voltage ($V_{REF}$), and a non-inverting input port connected to the input voltage port of the $R_{DAC}$, such that $V_B$ is equal to $V_{REF}$;
a second transistor connected to allow current to flow from the voltage supply to the voltage input port of the $R_{DAC}$, and further having a gate that is connected to receive an output of the second amplifier;
a third transistor;
a fourth transistor configured to allow current to flow from the voltage supply to a bias current port of the second amplifier; and
a startup circuit configured to output a signal to the gates of the first, third, and fourth transistor.

19. A method comprising:
allowing current to flow through a first transistor from a voltage supply to an output port;
producing an output voltage ($V_A$) at a resistance ladder, based on a digital input that indicates a voltage scaling factor, and an input voltage ($V_B$) received at a voltage input port of the resistance ladder;
receiving the output voltage ($V_A$) from the resistance ladder at an inverting input port of a first amplifier having an output port connected to a gate of the first transistor, wherein the non-inverting input is directly connected to the output port;
receiving a reference voltage ($V_{REF}$) at an inverting input port of a second amplifier, a non-inverting input port of the second amplifier connected to the input voltage port of the resistance ladder, such that $V_B$ is equal to $V_{REF}$;
allowing current flow through a second transistor from the voltage supply to the voltage input port of the resistance ladder, wherein the second transistor has a gate that is connected to receive an output of the second amplifier; and
outputting a signal from a startup circuit to the gates of the first transistor, a third transistor, and a fourth transistor, wherein the fourth transistor is configured to allow current to flow from the voltage supply to a bias current port of the second amplifier.

20. A method of designing a chip, the method comprising:
providing an initial design of the chip, the design including a first transistor and a resistance ladder configured to trim a reference voltage based on a programmable input;
fabricating a physical chip based on the initial design of the chip;
testing the chip to determine whether output currents are correct; and
if output currents are incorrect, adjusting the programmable input to the resistance ladder to correct the output currents;
wherein the first transistor is connected to allow current to flow from a voltage supply to an output port;
wherein the resistance ladder is configured to receive a digital input that indicates a voltage scaling factor, the resistance ladder further configured to receive an input voltage ($V_B$) at a voltage input port and produce an output voltage ($V_A$);
wherein a first amplifier includes an output port connected to a gate of the first transistor, an inverting input port receiving the output voltage ($V_A$) from the resistance ladder, and a non-inverting input directly connected to the output port of the first transistor, a second amplifier includes an inverting input port receiving a reference voltage ($V_{REF}$), and a non-inverting input port connected to the input voltage port of an $R_{DAC}$, such that $V_B$ is equal to $V_{REF}$, and a second transistor is connected to allow current to flow from the voltage supply to the voltage input port of the $R_{DAC}$, and further having a gate that is connected to receive an output of the second amplifier;
wherein a startup circuit is configured to output a signal to the gates of the first transistor, a third transistor, and a fourth transistor, the fourth transistor configured to allow current to flow from the voltage supply to a bias current port of the second amplifier.

21. A system for designing a chip, the system comprising:
a circuit having an initial design including a first transistor and a resistance ladder configured to trim a reference voltage based on a programmable input, wherein the chip is configured to allow for testing the chip to determine whether output currents are correct, and if output currents are incorrect, enabling user adjustment of the programmable input to the resistance ladder to correct the output currents;
wherein the first transistor of the circuit is connected to allow current to flow from a voltage supply to an output port;
wherein the resistance ladder is configured to receive a digital input that indicates a voltage scaling factor, the resistance ladder further configured to receive an input voltage ($V_B$) at a voltage input port and produce an output voltage ($V_A$);
wherein a first amplifier includes an output port connected to a gate of the first transistor, an inverting input port receiving the output voltage ($V_A$) from the resistance ladder, and a non-inverting input directly connected to the output port of the first transistor, a second amplifier includes an inverting input port receiving a reference voltage ($V_{REF}$), and a non-inverting input port connected to the input voltage port of an $R_{DAC}$, such that $V_B$ is equal to $V_{REF}$, and a second transistor is connected to allow current to flow from the voltage supply to the voltage input port of the $R_{DAC}$, and further having a gate that is connected to receive an output of the second amplifier;
wherein a startup circuit is configured to output a signal to the gates of the first transistor, a third transistor, and a fourth transistor, the fourth transistor configured to allow current to flow from the voltage supply to a bias current port of the second amplifier.

* * * * *

UNITED STATES PATENT AND TRADEMARK OFFICE
CERTIFICATE OF CORRECTION

Page 1 of 1

PATENT NO. : 11,237,585 B2
APPLICATION NO. : 15/796645
DATED : February 1, 2022
INVENTOR(S) : Carlos Dorta-Quiñones It is certified that error appears in the above-identified patent and that said Letters Patent is hereby corrected as shown below:

On the Title Page

Item (73) Assignee, please delete "MARVEL ASIA PTE, LTD." and insert --MARVELL ASIA PTE, LTD.--

Signed and Sealed this
Twelfth Day of April, 2022

Drew Hirshfeld
*Performing the Functions and Duties of the*
*Under Secretary of Commerce for Intellectual Property and*
*Director of the United States Patent and Trademark Office*